US007932520B2

(12) United States Patent
Lee et al.

(10) Patent No.: US 7,932,520 B2
(45) Date of Patent: Apr. 26, 2011

(54) ORGANIC LIGHT EMITTING DEVICE AND METHOD OF FABRICATING THE SAME

(75) Inventors: Seok-Woon Lee, Tainan County (TW); Sung-Soo Park, Tainan County (TW); Biing-Seng Wu, Tainan County (TW)

(73) Assignees: Chimei Innolux Corporation, Miao-Li County (TW); Chi Mei El Corporation, Tainan (TW)

( * ) Notice: Subject to any disclaimer, the term of this patent is extended or adjusted under 35 U.S.C. 154(b) by 869 days.

(21) Appl. No.: 11/695,823

(22) Filed: Apr. 3, 2007

(65) Prior Publication Data
US 2007/0235740 A1 Oct. 11, 2007

(30) Foreign Application Priority Data

Apr. 7, 2006 (TW) .............................. 95112526 A

(51) Int. Cl.
*H01L 29/04* (2006.01)
*H01L 21/84* (2006.01)
*G09G 3/32* (2006.01)

(52) U.S. Cl. ............. 257/72; 257/E21.412; 257/E27.12; 438/152; 345/80

(58) Field of Classification Search .................... 257/59, 257/72, E21.412, E27.12–E21.121; 345/76, 345/80, 82–83; 438/151–152
See application file for complete search history.

(56) References Cited

U.S. PATENT DOCUMENTS

| | | | |
|---|---|---|---|
| 5,620,800 | A | 4/1997 | De Leeuw et al. |
| 5,620,880 | A | 4/1997 | Sloma et al. |
| 6,870,197 | B2 | 3/2005 | Park et al. |
| 7,064,350 | B2 | 6/2006 | Park |
| 7,321,134 | B2 * | 1/2008 | Yoo ................................ 257/40 |
| 7,531,833 | B2 | 5/2009 | Kim et al. |
| 2004/0097161 | A1 | 5/2004 | Gourlay |
| 2005/0247936 | A1 * | 11/2005 | Bae et al. ......................... 257/59 |
| 2006/0081854 | A1 * | 4/2006 | Kim et al. ....................... 257/72 |
| 2007/0235730 | A1 * | 10/2007 | Lee et al. ......................... 257/40 |

FOREIGN PATENT DOCUMENTS

| | | |
|---|---|---|
| CN | 1638557 A | 7/2005 |
| CN | 1761371 A | 4/2006 |
| TW | 514751 | 12/2002 |
| TW | 200522358 | 3/2003 |
| TW | 200524468 | 7/2005 |
| WO | 02/078101 A1 | 10/2002 |

OTHER PUBLICATIONS

Joseph Shinar, "Organic Light-Emitting Devices—A Survey," AIP Press, Springer, New York (2004) pp. 14. Khalifa et al., "Hole injection and transport in ITO/PEDOT/PVK/A1 diodes," Materials Science and Engineering, C 21 (2002), pp. 277-282.
Kim et al., "Indium-tin oxide treatments for single- and double-layer polymeric light-emitting diodes: The relation between the anode physical, chemical, and morphological properties and the device performance," Journal of Applied Physics, vol. 84, No. 12, Dec. 15, 1998, pp. 6859-6870.

* cited by examiner

*Primary Examiner* — Matthew W Such
(74) *Attorney, Agent, or Firm* — Lowe Hauptman Ham & Berner LLP

(57) ABSTRACT

An organic light emitting device is formed by assembling a first substrate and a second substrate. The second substrate includes several sub-pixels. The first substrate includes several transistors and, for each subpixel, a first connecting electrode. The transistors are electrically connected to each other, and the first connecting electrode is electrically connected to the respective one of the transistors. Each sub-pixel includes a light-emitting region and a non light-emitting region. A second connecting electrode is formed within the non light-emitting region and projects toward the first substrate. The first and second substrates are electrically connected via the connection of the first and second connecting electrodes.

20 Claims, 5 Drawing Sheets

ORGANIC LIGHT EMITTING DEVICE AND METHOD OF FABRICATING THE SAME

This application claims the benefit of Taiwan application Serial No. 095112526, filed Apr. 07, 2006, the entirety of which is incorporated herein by reference.

TECHNICAL FIELD

The disclosure relates in general to an organic light emitting device and a method of fabricating the same, and more particularly, to an organic light emitting device with high aperture ratio and high reliability, and a method of fabricating the same at high yield rate.

BACKGROUND

In a conventional organic light emitting device (OLED) and a method of fabricating the same, a thin film transistor (TFT) circuit and a light emitting device are disposed on a substrate orderly to form a display device. The display device is then sealed by a cover plate to prevent moisture from entering the display device. As a result, the light emitting device is not damaged by moisture. Because the fabrication processes of the TFT and the light emitting device are performed orderly on the same substrate, the yield rate of the substrate is obtained by multiplying the yield rate of the TFT by the yield rate of the light emitting device, which is far less than the individual yield rates. Recently, the TFT and the light emitting device are fabricated on different substrates to increase the yield rate, the aperture ratio and the reliability of the organic light emitting display. Then, the two substrates are assembled together to form the display.

FIG. 1 is a cross-sectional, exploded view of a conventional organic light emitting device 100 formed by assembling two substrates is illustrated. As shown in FIG. 1, the organic light emitting device 100 includes into a first substrate 10 (also known as TFT substrate) and a second substrate 20 (also known as OLED substrate). Several switching transistors (not shown in FIG. 1), driver transistors 12 and electrical connecting units 14 are formed on the first substrate 10. The electric connecting units 14 are used for providing signals to the pixels on the second substrate 20. A light emitting device is formed on the second substrate 20 and includes, in each subpixel such as R, G, B, a first electrode 21, a light emitting layer (for example, for emitting red light, green light and blue light, respectively) 22 and a second electrode 25. An insulating layer 23 isolates the light emitting layer 22, the first electrode 21 and the second electrode 25 in each subpixel from the adjacent subpixel(s). A barrier wall 24 is used for isolating the second electrode 25 in each subpixel from the adjacent subpixel(s).

The organic light emitting display 100 is formed by assembling the first substrate 10 and the second substrate 20. The electrical connecting units 14 on the first substrate 10 are electrically connected to drains of the driver transistors 12. Therefore, after the two substrates are assembled together, the drains of the driver transistors 12 on the first substrate 10 are electrically connected to the pixel electrodes, e.g., the second electrodes 25, of the second substrate 20 through the electrical connecting units 14, for providing the light emitting device of the second substrate 20 with image signals.

When the two substrates are assembled together, the electric connecting units 14 directly contact the light emitting device in light-emitting regions, designated at R, G and B in FIG. 1, of the second substrate 20. Therefore, the light emitting device is easily damaged, and the yield rate is lowered.

SUMMARY

There is a need for an organic light emitting device with high aperture ratio and high reliability, and a method of fabricating the same at high yield rate.

According to a first aspect of the present invention, an organic light emitting device (OLED) is provided. The light emitting device is formed by assembling a first substrate and a second substrate. The second substrate includes several sub-pixels. Each subpixel includes a light-emitting region and a non light-emitting region. The first substrate comprises a plurality of transistors electrically connected to each other and corresponding to the subpixels of the second substrate, respectively and, for each sub-pixel, a first connecting electrode electrically connected to the respective one of the transistors. A second connecting electrode is disposed in the non light-emitting region of each sub-pixel and encompassed by a barrier wall. The top of the second connecting electrode is not lower than that of the barrier wall. The first connecting electrode is electrically connected to the second connecting electrode, so that the first substrate and the second substrate are electrically connected together.

According to a first aspect of the present invention, an organic light emitting device (OLED) is provided. The light emitting device is formed by assembling a first substrate and a second substrate. The second substrate comprises a plurality of sub-pixels, each sub-pixel comprising a light-emitting region and a non light-emitting region. The first substrate comprises a plurality of switching transistors and a plurality of driver transistors electrically connected to each other and corresponding to the subpixels of the second substrate, and, for each sub-pixel, a first connecting electrode electrically connected to the respective one of the driver transistors. The second substrate further comprises, for each sub-pixel, a second connecting electrode formed in the non light-emitting region, projecting towards the first substrate and comprising a conductive multilayer and a connecting body enclosed by the conductive multilayer. The first substrate and the second substrate are electrically connected by the electrical connection between the second connecting electrode and the first connecting electrode.

According to a third aspect of the present invention, a method of fabricating an organic light emitting device (OLED) from first and second substrates wherein the second substrate comprises a plurality of sub-pixels, and the first substrate comprises a plurality of transistors electrically connected to each other and corresponding to the subpixels of the second substrate, respectively, is provided. For each subpixel, a first connecting electrode is formed on the first substrate to be electrically connected to the respective one of the transistors. Each sub-pixel includes a light-emitting region and a non light-emitting region. For each subpixel, a second connecting electrode is formed in the non light-emitting region and projects toward the first substrate. The first substrate and the second substrate are assembled together so as to electrically connect the first connecting electrode and the second connecting electrode.

Additional aspects and advantages of the disclosed embodiments are set forth in part in the description which follows, and in part are apparent from the description, or may be learned by practice of the disclosed embodiments. The aspects and advantages of the disclosed embodiments may also be realized and attained by means of the instrumentalities and combinations particularly pointed out in the appended claims.

BRIEF DESCRIPTION OF THE DRAWINGS

Embodiments of the invention will now be described, by way of example only, with reference to the accompanying drawings in which elements having the same reference numeral designations represent like elements throughout and in which.

DETAILED DESCRIPTION OF EMBODIMENTS

In the following detailed description, for purposes of explanation, numerous specific details are set forth in order to provide a thorough understanding of the embodiments. It will be apparent, however, that the embodiments may be practiced without these specific details. In other instances, well-known structures and devices are schematically shown in order to simplify the drawings.

Figure 1:
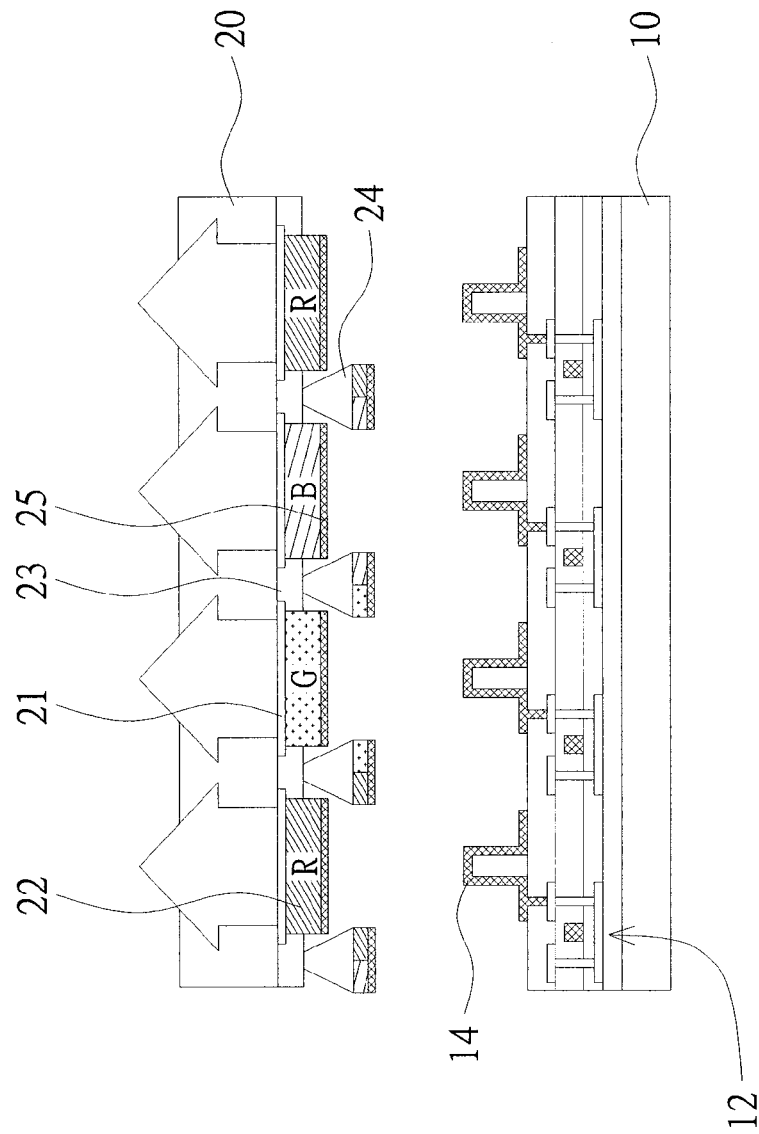
FIG. 1 is a cross-sectional, exploded view of a conventional organic light emitting device formed by assembling two substrates.

In an organic light emitting device and a method of fabricating the same according to embodiments of the present invention, after the first substrate and the second substrate are assembled together, the electrical connecting units do not directly contact the second electrode 25 in the light-emitting region of the second substrate 20 (shown in FIG. 1). As a result, the second electrode 25 and the light emitting layer 22 covered by the second electrode 22 are not damaged during the substrate assembling process. The first substrate and the second substrate are known as a TFT substrate and an OLED substrate, respectively. The thin film transistors on the TFT substrate could be p-type metal oxide semiconductor (PMOS), n-type metal oxide semiconductor (NMOS), or complementary metal oxide semiconductor (CMOS) transistors. Also, the thin film transistors could be fabricated by amorphous silicon technology or low temperature polysilicon (LTPS) technology.

Figure 2:
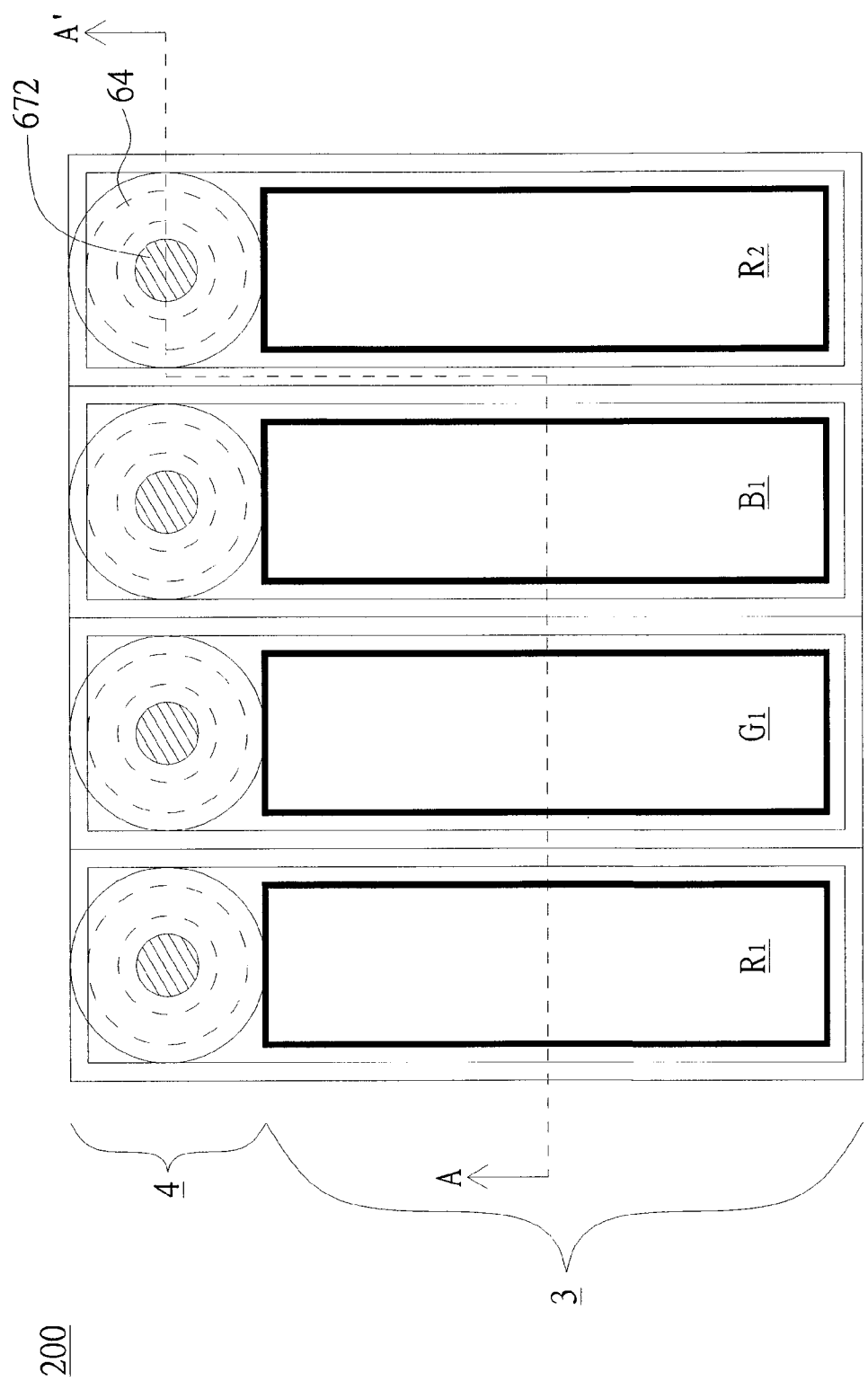
FIG. 2 is a top view of a pixel of an organic light emitting device according to an embodiment of the present invention.
Figure 3:
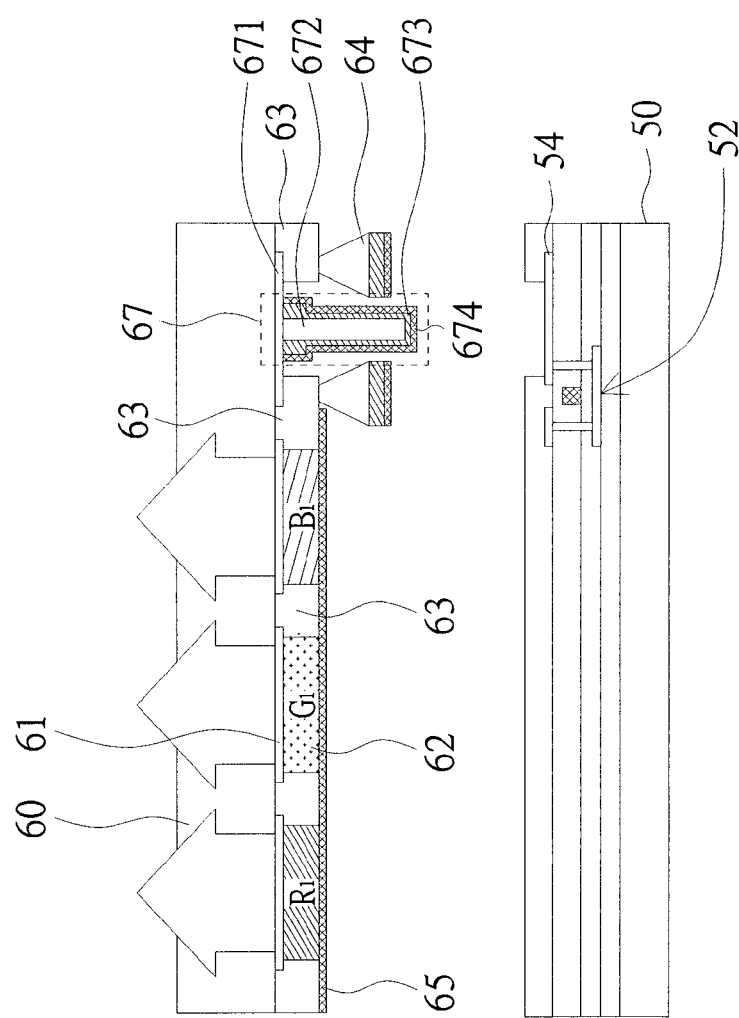
FIG. 3 is a cross-sectional, exploded view taken along line A-A' of FIG. 2.

FIG. 2 is a top view of a pixel an organic light emitting device 200 according to an embodiment of the present invention. FIG. 3 is a cross-sectional, exploded view taken along line A-A' of FIG. 2. The organic light emitting device (OLED) 200 is formed by assembling a first substrate 50 and a second substrate 60. The device 200 includes one or more pixels. Each pixel (FIG. 2) includes one or more sub-pixels each of which, in turn, includes a light-emitting region 3 and a non light-emitting region 4. As shown in FIG. 2, each pixel in this embodiment includes four sub-pixels including a red light-emitting region (R1), a green light-emitting region (G1), a blue light-emitting region (B1) and another red light-emitting region (R2). In each sub-pixel (R1, G1, B1 or R2), a barrier wall 64 defines a peripheral part surrounding a central part defined by a connecting body 672 of a second connecting electrode 67. The barrier wall 64 and the connecting body 672 are located in the non light-emitting region 4.

Figure 4B:
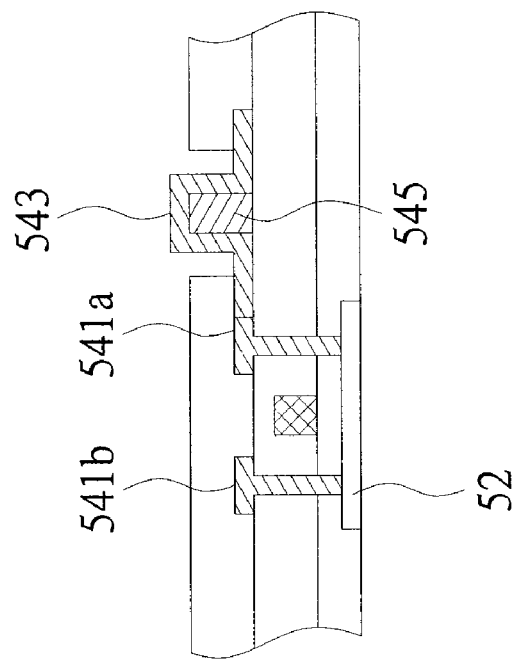
FIGS. 4A~4B illustrate two different types of the first connecting electrodes according to various embodiments of the present invention.
Figure 4A:
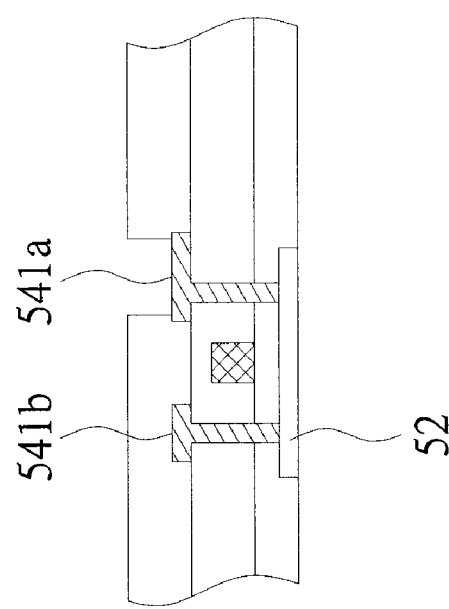

As shown in FIG. 3, several transistors and a first connecting electrode 54 are formed on the first substrate 50. The transistors are electrically connected to each other and include switching transistors (not shown in drawings) and driver transistors 52 (FIG. 3). The first connecting electrode 54 is electrically connected to one of the transistors. Also, the first connecting electrode 54 could be made of metal, metal alloy, metal oxide, metal adhesive, a structure coated with a conductive metal layer, or a conductive multilayer. In FIG. 4A and FIG. 4B, two different types of the first connecting electrodes 54 according to various embodiments of the present invention are illustrated, respectively. In embodiments suitable for practical applications, the first connecting electrode 54 could be a contact electrode 541a or contact electrode 541b electrically connected to a drain or a source of the respective transistor 52. In FIG. 4A, the first connecting electrode 54 is the contact electrode 541a. The drain or the source of the respective transistor 52 is electrically connected to an exterior circuit through the contact electrode 541a. Alternatively, the first connecting electrode 54 could further include an enhancive electrode 543 electrically connected to the contact electrode 541a, as shown in FIG. 4B. Also, the enhancive electrode 543 could further include an enhancive body 545. The enhancive body 545 could be made of metal, metal alloy, metal oxide, metal adhesive, a structure coated with a conductive metal layer, a conductive multilayer, or non-conductive material such as silicon oxide (SiOx), silicon nitride (SiNx) and polymers. In a preferred embodiment of the present invention, the first connecting electrode 54 is a contact electrode (such as the contact electrode 541a in FIG. 4A) of a source or a drain of the respective driver transistor 52 for reducing the number of masks used in the manufacturing process.

As shown in FIG. 3, a first electrode 61, a light emitting layer 62, an insulating layer 63, and a second electrode 65 are formed in the light emitting region 3 of each sub-pixel of the second substrate 60. The first electrode 61 could be made of transparent conductive material, such as metal, metal alloy and metal oxide. Examples of the light emitting layer 62 include emitting layers for emitting red light, green light and blue light, respectively. Also, the light emitting layer 62 could include the organic light-emitting layer of the light emitting device and could be selected from the group consisting of a hole injection layer (HIL), a hole transport layer (HTL), an emitting layer (EL), an electron transport layer (ETL), an electron injection layer (EIL) and a carrier blocking layer. The second electrode 65 could be made of aluminum (Al), calcium (Ca), magnesium (Mg), or a double-layer structure such as lithium/aluminum fluoride (LiF/Al), or other conductive materials. The insulating layer 63 electrically isolates the light emitting layers 62 and the first electrode 61 of each subpixel from the adjacent subpixel(s).

It should be noted that the second connecting electrode 67 is formed in the non light-emitting region 4 of the second substrate 60. The second connecting electrode 67 projects towards the first substrate 50. The top (lowest face in FIG. 3) of the second connecting electrode 67 is not lower than (or protrudes beyond) the top of the barrier wall 64. In an embodiment, the second connecting electrode 67 includes a conductive multilayer and a connecting body 672 enclosed by the conductive multilayer.

As shown in FIG. 3, the second connecting electrode 67 in the non light-emitting region 4 includes, in accordance with an embodiment, a lower electrode 671, the connecting body 672, an organic layer 673 and an upper electrode 674. The lower electrode 671 is located on the second substrate 60 and electrically connected to the first electrode 61 in the respective light-emitting region 3 of the same subpixel. The connecting body 672 is formed on the lower electrode 671, and the organic layer 673 is formed on the connecting body 672. The upper electrode 674 is formed on the connecting body 672 and encloses the organic layer 673 and the connecting body 672. Also, the upper electrode 674 is electrically connected to, and preferably in direct contact with, the lower electrode 671. The connecting body 672 could be a patterned conductor or a non-conductive post.

After the first substrate 50 is assembled with the second substrate 60, the second connecting electrode 67 projecting toward the first substrate 50 is electrically connected to the first connecting electrode 54 through, e.g., direct contact between the first connecting electrode 54 and the second connecting electrode 67. As a result, the driver transistor 52 of the first substrate 50 is electrically connected to a pixel electrode, such as the first electrode 61 of the respective subpixel on the second substrate 60, so that a driving signal is transmitted to the first electrode 61 of the second substrate 60 through the second connecting electrode 67. Therefore, the light emitting device of the second substrate 60 is capable of receiving electrical signals from the first substrate 50.

Furthermore, in an embodiment, the barrier wall 64 is formed on the insulating layer 63 and encompasses the second connecting electrode 67 for separating or electrically isolating the second electrode 65 in the light-emitting region 3 from the second connecting electrode 67 in the non light-emitting region 4. The insulating layer 63 between the barrier wall 64 and the second substrate 60 increases the adhesion of the barrier wall 64 to the second substrate 60. Alternatively, the barrier wall 64 can be directly formed on the second substrate 60. There is no particular limitation on the position of the barrier wall 64 in the present invention.

In an embodiment suitable for practical application, the lower electrode 671 in the non light-emitting region 4 and the first electrode 61 in the light-emitting region 3 on the second substrate 60 could be made, preferably simultaneously, of the same material. Similarly, the organic layer 673 in the non light-emitting region 4 and the light emitting layer 62 in the light-emitting region 3 could be made, preferably simultaneously, of the same material and have the same structure. Also, the upper electrode 674 and the second electrode 65 could be made, preferably simultaneously, of the same material.

Figure 5:
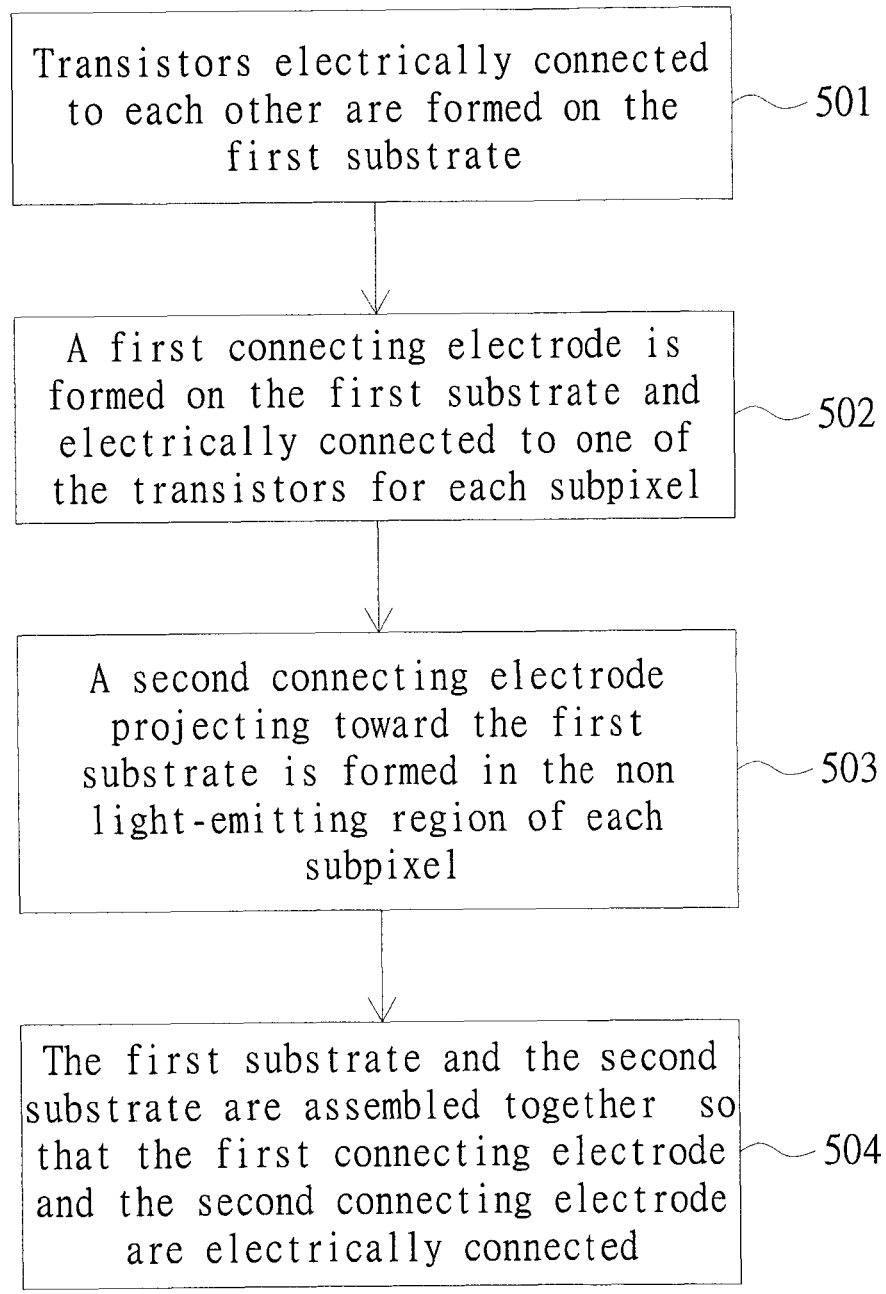
FIG. 5 is a flow chart of a method of fabricating an organic light emitting device according to an embodiment of the present invention.

FIG. 5 is a flow chart of a method of fabricating an organic light emitting device according to an embodiment of the present invention. First, as shown in step 501, a first substrate 50 is provided, and several transistors (including driver transistors 52) electrically connected to each other are formed on the first substrate 50. Next, as shown in step 502, for each transistor used for transmitting signals to the second substrate 60, a first connecting electrode 54 is formed on the first substrate 50 and electrically connected to the transistor. Then, as shown in step 503, a second substrate 60 including several sub-pixels is provided. Each sub-pixel includes a light-emitting region 3 and a non light-emitting region 4. A second connecting electrode 67 projecting toward the first substrate 50 is formed in the non light-emitting region 4 of each subpixel. Afterwards, as shown in step 504, the first substrate 50 and the second substrate 60 are assembled together, so that the first connecting electrode 54 and the second connecting electrode 67 are electrically connected to each other.

In the formation of components on the second substrate 60, the connecting body 672 projects toward the first substrate 50.

Also, the lower electrode 671 in the non light-emitting region 4 and the first electrode 61 in the light-emitting region 3 could be formed simultaneously (i.e., in the same manufacturing step). The organic layer 673 in the non light-emitting region 4 and the light emitting layer 62 in the light-emitting region 3 could be formed simultaneously. Also, the upper electrode 674 and the second electrode 65 could be formed simultaneously.

When the second connecting electrode 67 does not include the organic layer 673, the mask, e.g., a metal mask, used for forming the organic light emitting layer 62 has to cover the connecting or non light-emitting region 4. Due to inherent inaccuracy of the positioning process and fabrication process of the metal mask, the metal mask has to cover a larger area than the connecting region 4. As a result, the light-emitting region 3 is reduced, and the aperture ratio is decreased. However, in order to ensure complete and reliable electrical connection between the upper electrode 674 and the lower electrode 671 in the non light-emitting region 4, the light emitting layers could be formed according to the aforementioned steps.

In the other hand, a metal mask for the light emitting layer 62 that does not cover the region of the second connecting electrode 67 is preferably used in order to obtain a high aperture ratio in the OLED device. The upper electrode 674 and the lower electrode 671 can be electrically connected together for transmitting driving signals from the first substrate 50 to the respective subpixel of the second substrate 60 without reducing the light emitting region 3, and this could be performed by one of the following methods.

(1) By forming the upper electrode 674 and the organic layer 673 from molecules that have different size and kinetic energy, so that the area in the region of the second connecting electrode 67 covered by the upper electrode 674 is larger than that covered by the organic layer 673. The edge of the upper electrode 674 is directly contacted with and connected to the edge of the lower electrode 671 adjacent to the bottom of the barrier wall 64. In operation, electrical current flows to the lower electrode 671 from the upper electrode 674.

(2) By positioning the evaporation source of the second electrode 65 and the upper electrode 674 closer to the second substrate 60 than the evaporation source of the organic layer 673 and the light emitting layer 62 during the evaporation process. As a result, the evaporation area of the organic layer 673 in the region of the second connecting electrode 67 is smaller than that of the upper electrode 674, so that it is easier to electrically connect the upper electrode 674 and the lower electrode 671.

(3) By forming the angle α between the barrier wall 64 and the surface of the insulation layer 63 (or the horizontal plane or the surface of the second substrate) to be small, it is easy to electrically connect the upper electrode 674 and the lower electrode 671. The angle is preferably less than 70° and more preferably between 40° and 60°, and most preferably between 55° and 60°.

Moreover, when two substrates are assembled together, the first connecting electrode 54 and the second connecting electrode 67 contact each other, in some embodiments directly, in the non light-emitting region 4. Accordingly, the light emitting device in the light-emitting region 3 is not damaged during the substrate assembling process. Furthermore, the contact electrode, e.g., 541a, 541b or 534 in FIGS. 4A-4B, of the source or the drain of the driver transistor 52 is used as the first connecting electrode 54 for reducing the number of required masks. Besides, the second connecting electrode 67 projects toward the first substrate 50 and has a height no lower than the height of the barrier wall 64. When the area of the first connecting electrode 54 is slightly enlarged and the projecting second connecting electrode 54 is constructed, the requirement of substrate assembly accuracy can be lowered, and the yield rate of production is consequently increased.

As stated above, the displays including the organic light emitting device in accordance with embodiments of the present invention has high aperture ratio and high reliability and can be produced at high yield rate.

While the invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of the invention.

What is claimed is:

1. An organic light emitting device (OLED), comprising:
   a first substrate; and
   a second substrate, opposing the first substrate and comprising a plurality of sub-pixels, each said sub-pixel comprising a light-emitting region and a non light-emitting region;
   wherein the first substrate comprises
      a plurality of transistors electrically connected to each other and corresponding to the plurality of sub-pixels of the second substrate, respectively; and
      for each said sub-pixel, a first connecting electrode electrically connected to the respective one of the plurality of transistors;
   wherein the second substrate further comprises, for each said sub-pixel,
      a second connecting electrode formed in the non light-emitting region, the second connecting electrode including a lower electrode, a connecting body, an organic layer and an upper electrode, the organic layer disposed between the connecting body and the upper electrode, the lower electrode and the upper electrode enclosing the connecting body and the organic layer, and
      a barrier wall encompassing the second connecting electrode, wherein a top of the second connecting electrode is no lower than a top of the barrier wall; and
   wherein the second connecting electrode is electrically connected to the first connecting electrode, so that the first substrate and the second substrate are electrically connected.

2. The device according to claim 1, wherein the plurality of transistors on the first substrate comprises a plurality of switching transistors and a plurality of driver transistors, the first connecting electrode comprises a contact electrode on a source or a drain of the respective one of the plurality of driver transistors.

3. The device according to claim 2, wherein the first connecting electrode further comprises an enhancive electrode electrically connected to the contact electrode of the source or the drain of the respective one of the plurality of driver transistors.

4. The device according to claim 1, wherein the light-emitting region in each said sub-pixel of the second substrate comprises:
   a first electrode formed on the second substrate;
   a light emitting layer formed over the first electrode; and
   a second electrode formed over the light emitting layer.

5. The device according to claim 4, wherein the second connecting electrode in the non light-emitting region of each said sub-pixel of the second substrate comprises:
   the lower electrode, formed on the second substrate and electrically connected to the first electrode in the light-emitting region; and
   the connecting body formed on the lower electrode; and
   the upper electrode formed on the connecting body.

6. The device according to claim 5, wherein the connecting body is a patterned conductor or a non-conductive pattern.

7. The device according to claim 5, wherein the lower electrode in the non light-emitting region of each said sub-pixel on the second substrate is made of the same material as the first electrode in the light-emitting region.

8. The device according to claim 5, wherein the upper electrode in the non light-emitting region of each said sub-pixel on the second substrate is made of the same material as the second electrode in the light-emitting region.

9. The device according to claim 8, wherein the light emitting layer in the light-emitting region of each said sub-pixel on the second substrate is made of the same material as the organic layer in the non light-emitting region.

10. An organic light emitting device (OLED), comprising:
    a first substrate; and
    a second substrate opposing the first substrate and comprising a plurality of sub-pixels, each said sub-pixel comprising a light-emitting region and a non light-emitting region;
    wherein the first substrate comprises:
    a plurality of switching transistors and a plurality of driver transistors electrically connected to each other and corresponding to the plurality of sub-pixels of the second substrate; and
    for each said sub-pixel, a first connecting electrode electrically connected to a respective one of the plurality of driver transistors;
    wherein the second substrate further comprises, for each said sub-pixel, a second connecting electrode formed in the non light-emitting region, projecting towards the first substrate and comprising a conductive multilayer enclosing an organic layer and a connecting body, the organic layer disposed between the connecting body and an upper electrode;
    wherein the first substrate and the second substrate are electrically connected by an electrical connection between the second connecting electrode and the first connecting electrode.

11. The device according to claim 10, wherein the first connecting electrode comprises a contact electrode of a source or a drain of the respective one of the plurality of driver transistors.

12. The device according to claim 11, wherein the first connecting electrode further comprises an enhancive electrode disposed over the contact electrode of the source or the drain of the respective one of the driver transistors.

13. The device according to claim 10, wherein the light-emitting region in each said sub-pixel on the second substrate further comprises:
    a first electrode, formed on the second substrate;
    a light emitting layer, formed on the first electrode; and
    a second electrode, formed on the light emitting layer.

14. The device according to claim 13, wherein in each said sub-pixel on the second substrate, the conductive multilayer of the second connecting electrode in the non light-emitting region comprises:

a lower electrode, formed on the second substrate and electrically connected to the first electrode in the light-emitting region, wherein the connecting body is formed on the lower electrode; and the upper electrode, formed on the connecting body and encompassing the connecting body, the upper electrode being electrically connected to the lower electrode outside the connecting body.

15. The device according to claim 14, further comprising at least one of the following:

wherein the lower electrode in the non light-emitting region of the second substrate is made of the same material as the first electrode in the light-emitting region, wherein the upper electrode in the non light-emitting region is made of the same material as the second electrode in light-emitting region, and wherein the organic layer in the non light-emitting region is made of the same material as the light emitting layer in the light-emitting region.

16. A method of fabricating an organic light emitting device (OLED) from first and second substrates wherein the second substrate comprises a plurality of sub-pixels, and the first substrate comprises a plurality of transistors electrically connected to each other and corresponding to the plurality of sub-pixels of the second substrate, respectively, said method comprising:

for each said sub-pixel, forming a first connecting electrode on the first substrate and electrically connecting the first connecting electrode to the respective one of the plurality of transistors;

defining in each said sub-pixel a light-emitting region and a non light-emitting region;

forming a second connecting electrode in the non light-emitting region of each said sub-pixel, the second connecting electrode including a lower electrode, a connecting body, an organic layer and an upper electrode, the lower electrode and the upper electrode enclosing the connecting body and the organic layer, the organic layer between the connecting body and the upper electrode, the second connecting electrode projecting toward the first substrate; and assembling the first substrate and the second substrate for electrically connecting the first connecting electrode and the second connecting electrode.

17. The method according to claim 16 further comprising, for each said sub-pixel:

forming a first electrode in the light-emitting region on the second substrate;

forming a light-emitting layer over the first electrode in the light-emitting region on the second substrate; and forming a second electrode over the light-emitting layer in the light-emitting region on the second substrate.

18. The method according to claim 17, wherein step of forming the second connecting electrode in each said sub-pixel comprises:

forming the lower electrode on the second substrate and electrically connecting the lower electrode to the first electrode in the light-emitting region;

forming a the connecting body over the lower electrode, and the connecting body projecting toward the first substrate; and forming the upper electrode for covering the connecting body, and electrically connecting the upper electrode and the lower electrode.

19. The method according to claim 18, further comprising at least one of the following:

wherein the lower electrode in the non light-emitting region of the second substrate and the first electrode in the light-emitting region are formed at the same time and from the same material;

wherein the upper electrode in the non light-emitting region on the second substrate and the second electrode in the light-emitting region are formed at the same time and from the same material; and wherein the organic layer in the non light-emitting region and the light-emitting layer in the light-emitting region are formed at the same time and from the same material.

20. The method according to claim 18, wherein the transistors on the first substrate comprise a plurality of switching transistors and driver transistors; and for each said sub-pixel, the first connecting electrode comprises a contact electrode of a source or a drain of the respective one of the driver transistors.

* * * * *